(12) United States Patent
Morino (10) Patent No.: US 7,863,942 B2
(45) Date of Patent: Jan. 4, 2011

(54) VOLTAGE DETECTING CIRCUIT

(75) Inventor: Koichi Morino, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 161 days.

(21) Appl. No.: 12/357,694

(22) Filed: Jan. 22, 2009

(65) Prior Publication Data

US 2009/0189668 A1     Jul. 30, 2009

(30) Foreign Application Priority Data

Jan. 24, 2008    (JP)   ............... 2008-013449
Mar. 25, 2008    (JP)   ............... 2008-078182

(51) Int. Cl.
    *H03K 5/22*     (2006.01)
(52) U.S. Cl. .................................................. 327/77
(58) Field of Classification Search ............... 327/77
See application file for complete search history.

(56) References Cited

U.S. PATENT DOCUMENTS 7,034,581 B2 *   4/2006   Sudou ........................ 327/77
7,365,571 B2 *   4/2008   Seo et al. ..................... 326/83
2006/0066359 A1 *   3/2006   Tso et al. ................... 327/77

FOREIGN PATENT DOCUMENTS

JP     2004-163315     6/2004

* cited by examiner

*Primary Examiner*—Lincoln Donovan
*Assistant Examiner*—William Hernandez
(74) *Attorney, Agent, or Firm*—Cooper & Dunham LLP (57) ABSTRACT

A voltage detecting circuit for comparing a voltage to be detected with a reference voltage and outputting an output signal having a level depending on the comparison is disclosed. The voltage detecting circuit includes an inverting amplifier circuit configured to receive an intermediate signal having a level depending on the comparison and output the output signal. The inverting amplifier circuit includes an active element having a control terminal. A threshold voltage of the control terminal is as low as or lower than the reference voltage. The voltage to be detected is applied to the control terminal of the active element.

14 Claims, 12 Drawing Sheets

FIG.12

VOLTAGE DETECTING CIRCUIT

BACKGROUND OF THE INVENTION

1. Field of the Invention

The present invention relates to a voltage detecting circuit, and more specifically, to a voltage detecting circuit capable of accurately detecting a voltage even when a power source voltage is decreased.

2. Description of the Related Art

In portable information devices such as portable phones and mobile PCs, or systems such as car navigation systems, power is supplied by storage batteries. Such a power source device, which is charged to be used, is gradually discharged as a device having the power source device is used or in the course of time. As a result, the power source voltage is decreased. When the power source voltage is decreased to be lower than a predetermined level, the device cannot be operated normally. Conventionally, the power source voltage decreased to be lower than the predetermined level has been detected and a warning to charge the storage battery and the like has been given to a user. To realize such functions, a voltage detecting circuit capable of detecting a power source voltage has been used. By using the voltage detecting circuit, the power source voltage is detected as required and various processes can be performed based on the detected power source voltage.

Figure 10:
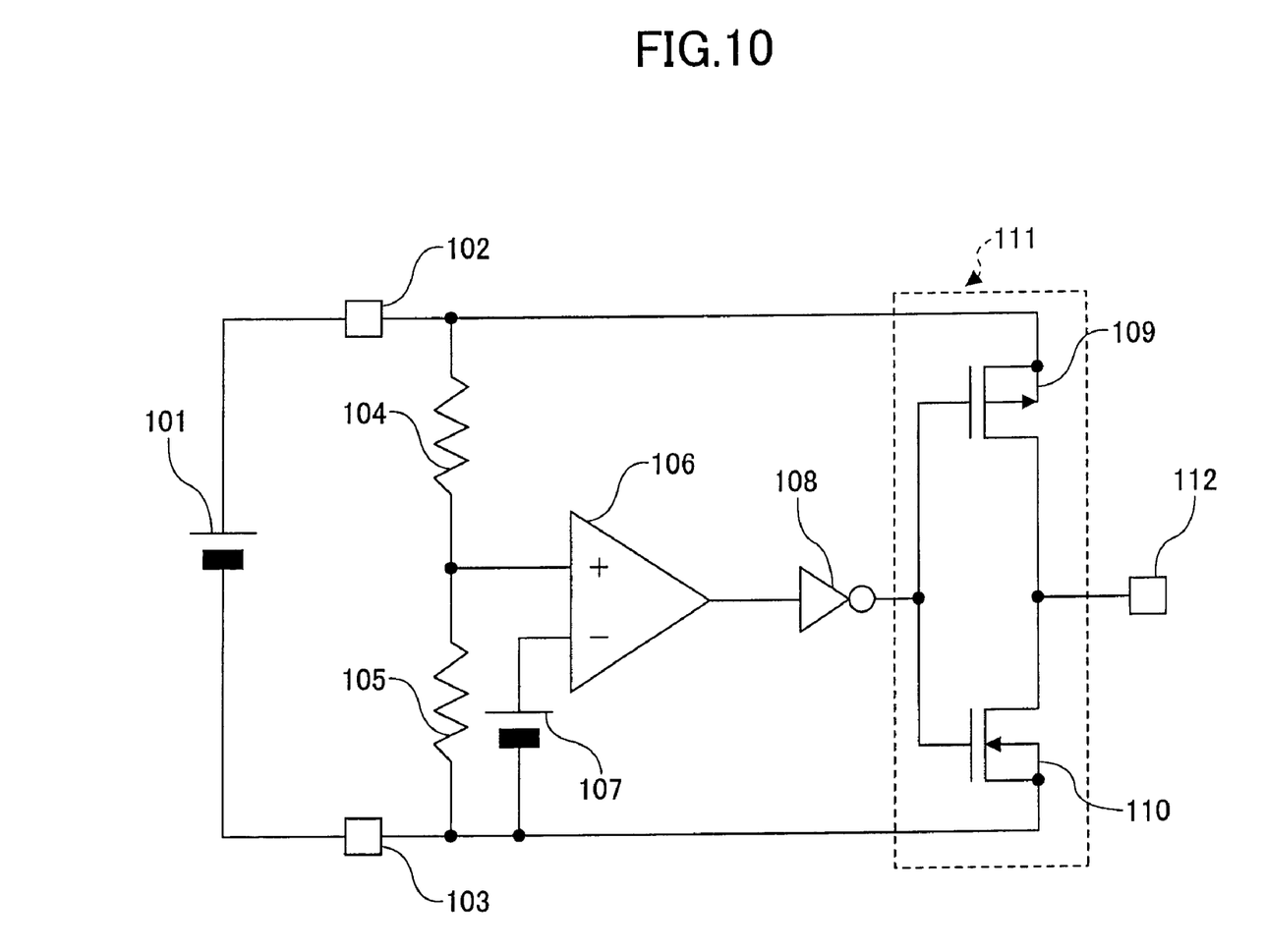
FIG. 10 is a conventional general voltage detecting circuit.

FIG. 10 shows a general purpose voltage detecting circuit. In the circuit shown in FIG. 10, reference numeral 101 denotes a power source capable of supplying a voltage to be detected. That is, in this voltage detecting circuit, a voltage between terminals 102 and 103 is detected. Voltage dividing resistors 104 and 105 are connected between the terminals 102 and 103. The voltage between the terminals 102 and 103 is divided by the voltage dividing resistors 104 and 105, and inputted to a non-inverting input terminal of a comparator 106. On the other hand, a reference voltage is supplied from a power source 107 to an inverting input terminal of the comparator 106. An output terminal of the comparator 106 is connected to an inverter 108. An output terminal of the inverter 108 is connected to a common gate terminal of a PMOS transistor 109 and an NMOS transistor 110. The PMOS transistor 109 and the NMOS transistor 110 form an output circuit 111. Drain terminals of the PMOS transistor 109 and the NMOS transistor 110, which are connected function as an output terminal 112. In this voltage detecting circuit, a voltage at a connection between the voltage dividing resistors 104 and 105 and the reference voltage of the power source 107 are compared by the comparator 106. By detecting an inversion of an output voltage of the comparator 106, it is detected that the power source voltage 101, that is an input voltage, is decreased to be lower than a predetermined level.

In such a voltage detecting circuit, an output voltage of the output circuit 111 becomes unstable when an applied voltage is not higher than an operational voltage. Each of the PMOS transistor 109 and the NMOS transistor 110 forming the output circuit 111 is turned on when a voltage as high as or higher than its threshold voltage is applied between its gate and its source. When the power source voltage 101 is decreased, however, an operation of a differential amplifier circuit included in the comparator 106 becomes unstable. Therefore, operations of the PMOS transistor 109 and the NMOS transistor 110 become unstable, which makes it impossible to obtain a correct originally output voltage.

Figure 11:
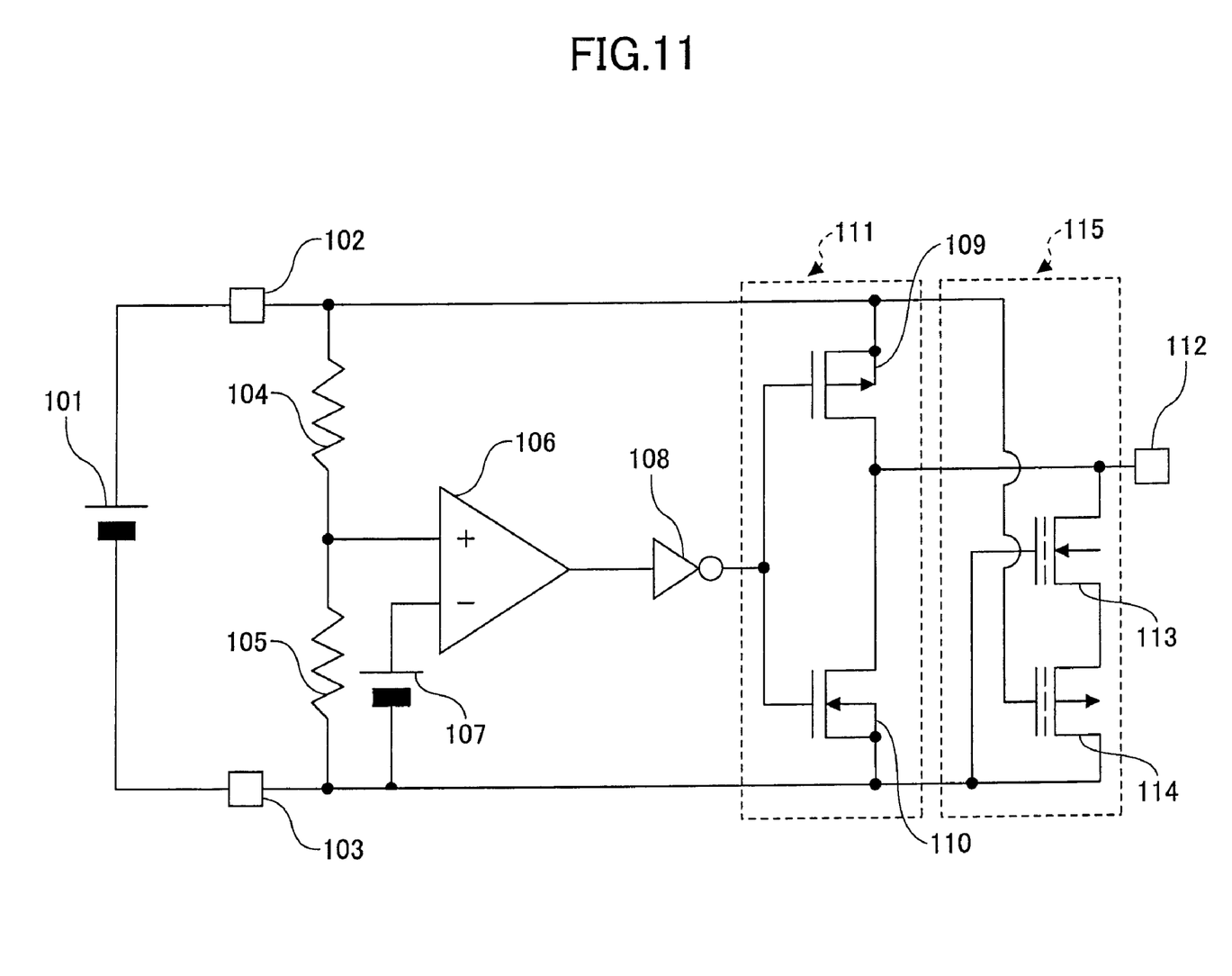
FIG. 11 is a conventional voltage detecting circuit.

In view of this, there is a voltage detecting circuit disclosed in Patent Document 1, which operates correctly even when a power source voltage is decreased. FIG. 11 shows a voltage detecting circuit disclosed in Patent Document 1. In FIG. 11, a second output circuit 115 formed of a depletion mode NMOS transistor 113 and a depletion mode PMOS transistor 114 is provided in a subsequent stage after the output circuit 111 of FIG. 10. The depletion mode PMOS transistor 114 has a gate terminal connected to a positive electrode (terminal 102) of a power source to be detected while the depletion mode NMOS transistor 113 has a gate terminal connected to a negative electrode (terminal 103) of the power source to be detected. The depletion mode PMOS transistor 114 and the depletion mode NMOS transistor 113 are connected in series between the output terminal 112 and the terminal 103. As a result, even when the power source voltage 101 is decreased, the voltage level of the output terminal 112 can be held low or high and the output voltage can be prevented from becoming unstable.

[Patent Document 1] Japanese Patent Application Publication No. 2004-163315

In the voltage detecting circuit shown in FIG. 11, however, there is a problem in that a threshold value of each transistor cannot be easily controlled due to manufacturing reasons since the P-type depletion mode MOS transistor 114 and the N-type depletion mode MOS transistor 113 are used.

SUMMARY OF THE INVENTION

The present invention is made in view of solving the aforementioned problems and it is an object of at least one embodiment of the present invention to provide a voltage detecting circuit which is capable of correctly detecting a voltage even when a power source voltage is decreased and can be easily manufactured.

According to one aspect of the present invention, a voltage detecting circuit for comparing a voltage to be detected with a reference voltage and outputting an output signal having a level depending on the comparison is provided. The voltage detecting circuit includes an inverting amplifier circuit configured to receive an intermediate signal having a level depending on the comparison and output the output signal. The inverting amplifier circuit includes an active element having a control terminal. A threshold voltage of the control terminal is as low as or lower than the reference voltage. The voltage to be detected is applied to the control terminal of the active element.

According to another aspect of the present invention, a voltage detecting circuit is configured to compare a voltage to be detected with a reference voltage and output an output signal having a level depending on the comparison. The voltage detecting circuit includes a first power source terminal, a second power source terminal, a reference voltage generating circuit capable of generating the reference voltage, a differential amplifier circuit, and an inverting amplifier circuit. The inverting amplifier circuit includes a first MOS enhancement mode transistor having a source terminal connected to the first power source terminal, and a second MOS enhancement mode transistor having a source terminal connected to the second power source terminal through a current source. Drain terminals of the first and second MOS enhancement mode transistors being connected to each other. The voltage to be detected and the reference voltage are inputted to the differential amplifier circuit. An output signal of the differential amplifier circuit is inputted to a gate terminal of the first MOS enhancement mode transistor and the voltage to be detected is inputted to a gate terminal of the second MOS enhancement mode transistor. A connection between the drain terminals of the first and second MOS enhancement mode transistors functions as an output of the voltage detecting circuit.

According to another aspect of the present invention, a voltage detecting circuit is configured to compare a voltage to be detected with a reference voltage and output an output signal having a level depending on the comparison. The voltage detecting circuit includes a first power source terminal, a second power source terminal, and an output circuit through which the output signal is outputted. The output circuit includes an inverter and an active element connected in series between the first power source terminal and the second power source terminal. The level of the output signal is stabilized by turning off the active element when a voltage of the first power source terminal is decreased lower than a predetermined level.

According to another aspect of the present invention, a voltage detecting circuit includes a power source terminal, a differential amplifier circuit, and an inverting amplifier circuit. The differential amplifier circuit includes a first MOS enhancement mode transistor and a second MOS enhancement mode transistor having source terminals connected to the power source terminal, and a MOS depletion mode transistor and a third MOS enhancement mode transistor having grounded source terminals. Gate terminals of the first and second MOS enhancement mode transistors are connected together to a drain terminal of the second MOS enhancement mode transistor. The MOS depletion mode transistor has a gate terminal and a source terminal connected to each other and a drain terminal connected to a drain terminal of the first MOS enhancement mode transistor. The third MOS enhancement mode transistor has a drain terminal connected to a drain terminal of the second MOS enhancement mode transistor. The inverting amplifier circuit includes a fourth MOS enhancement mode transistor having a source terminal connected to the power source terminal and a fifth MOS enhancement mode transistor having a source terminal connected to ground potential through a current source. The fourth and fifth MOS enhancement mode transistors have drain terminals connected to each other. The drain terminal of the first MOS enhancement mode transistor is connected to a gate terminal of the fourth MOS enhancement mode transistor. The voltage to be detected is inputted to gate terminals of the third and fifth MOS enhancement mode transistors. A connection between the fourth and fifth MOS enhancement mode transistors functions as an output of the voltage detecting circuit.

DETAILED DESCRIPTION OF THE PREFERRED EMBODIMENTS

Embodiments of the present invention are described with reference to the drawings.

Figure 1:
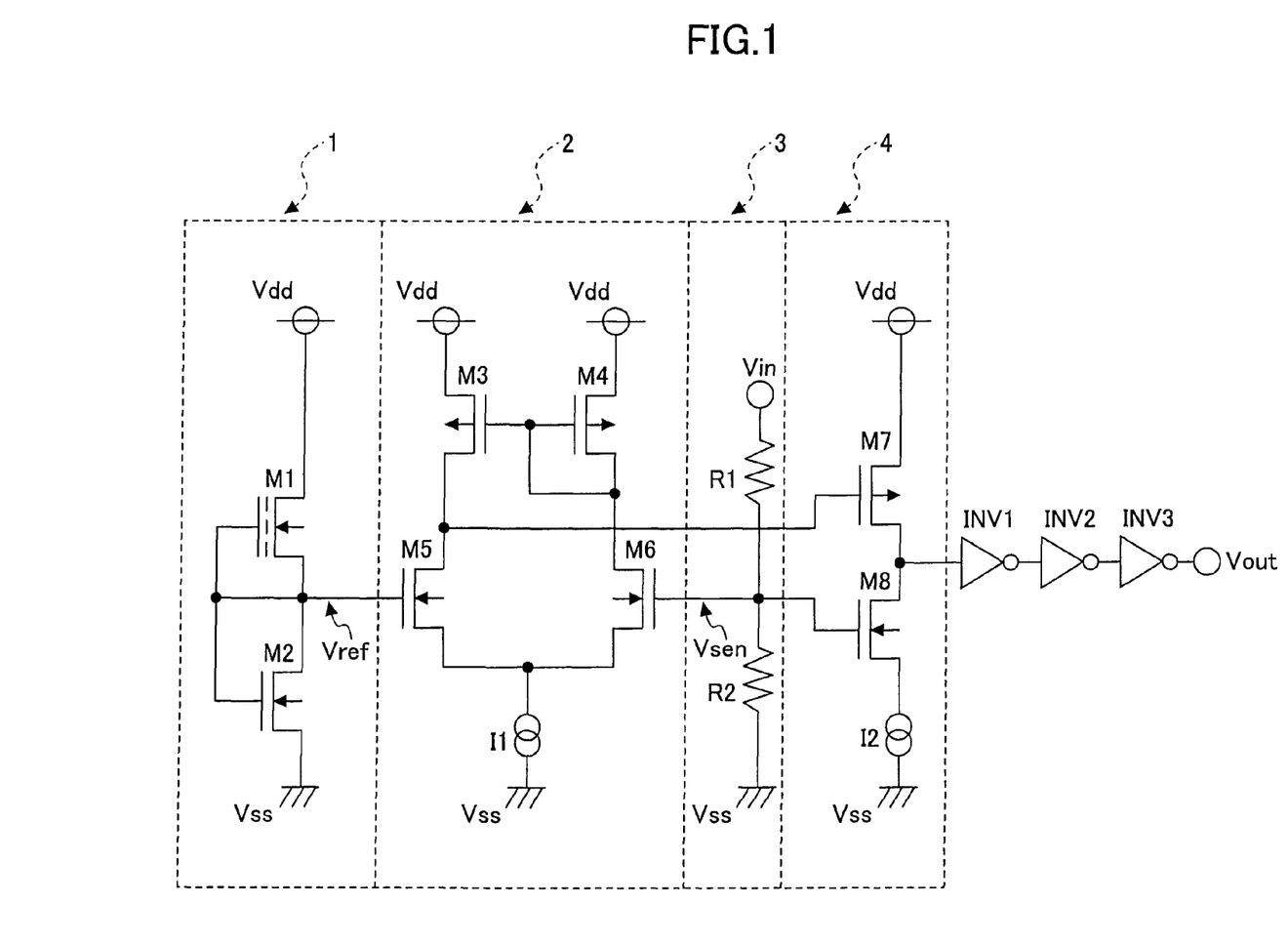
FIG. 1 is a voltage detecting circuit configuration of a first embodiment of the present invention.

FIG. 1 is a voltage detecting circuit showing a first embodiment of the present invention. This voltage detecting circuit includes an NMOS depletion mode transistor M1, NMOS enhancement mode transistors M2, M5, and M6, PMOS enhancement mode transistors M3, M4, and M7, current sources I1 and I2, inverters INV1 through INV3, and resistors R1 and R2. Further, an NMOS enhancement mode transistor M8 is provided between a drain of the PMOS enhancement mode transistor M7 and the current source I2. Moreover, a power source terminal Vdd, ground potential Vss, a voltage input terminal Vin, and an output terminal Vout are provided.

Here, a voltage to be monitored by the voltage detecting circuit is inputted to the input terminal Vin while a power source voltage by which this voltage detecting circuit is operated is inputted to the power source terminal Vdd. The voltage detecting circuit of the present invention can correctly detect a voltage Vin even when the power source voltage Vdd is decreased, however, the power source voltage 101 and the input terminal 102 may be short-circuited as in the conventional circuit shown in FIG. 10 or 11. That is, the power source terminal Vdd and the input terminal Vin in FIG. 1 may be short-circuited as well. With such a configuration, a decrease of the input voltage Vin (that is, the power source voltage Vdd) is monitored. In the configuration of FIG. 1 where these terminals are not short-circuited, on the other hand, a desired voltage Vin which is different than the power source voltage Vdd can be monitored.

In FIG. 1, a reference voltage generating circuit 1 is formed of the NMOS depletion mode transistor M1 and the NMOS enhancement mode transistor M2, and generates a reference voltage Vref.

The NMOS depletion mode transistor M1 has a drain connected to the power source terminal Vdd, and a source and a gate which are commonly connected to a drain of the NMOS enhancement mode transistor M2. The NMOS enhancement mode transistor M2 has a gate connected to its drain, and a source connected to ground potential.

Since the gate and the source of the NMOS depletion mode transistor M1 are connected, a zero bias voltage is applied as a gate voltage and a drain current has a predetermined constant current value. This constant current flows as a drain current of the NMOS enhancement mode transistor M2, therefore, a gate voltage of the NMOS enhancement mode transistor M2 is a constant voltage determined by the drain current. Since the gate of the NMOS enhancement mode transistor M2 is connected to its drain, a drain voltage of the NMOS enhancement mode transistor M2 becomes equal to its gate voltage, which is a constant voltage. Then, this constant voltage is taken out as the reference voltage Vref.

A differential amplifier circuit 2 is formed of the NMOS enhancement mode transistors M5 and M6, the PMOS enhancement mode transistors M3 and M4, and the current source I1.

The NMOS enhancement mode transistors M5 and M6 serve as differential input transistors. Sources of the NMOS enhancement mode transistors MS and M6 are commonly connected to ground potential through the current source I1. The reference voltage Vref is inputted to a gate of the NMOS enhancement mode transistor M5. Further, a voltage Vsen to be detected, which is obtained by dividing the voltage inputted to the voltage input terminal Vin by the resistors R1 and R2, is inputted to a gate of the NMOS enhancement mode transistor M6. Here, a circuit 3 including the resistors R1 and R2 and capable of dividing the voltage inputted to the voltage input terminal Vin is called a voltage dividing circuit. Since the voltage inputted to the voltage input terminal Vin and the voltage Vsen are proportional to each other, it can be detected that the voltage inputted to the voltage input terminal Vin has become as low as or lower than the predetermined level by comparing the voltage Vsen and the reference voltage Vref.

Sources of the PMOS enhancement mode transistors M3 and M4 are connected to the power source terminal Vdd. Gates of the PMOS enhancement mode transistors M3 and M4 are commonly connected to a drain of the PMOS enhancement mode transistor M4. A drain of the PMOS enhancement mode transistor M3 is connected to a drain of the NMOS enhancement mode transistor M5. The drain of the PMOS enhancement mode transistor M4 is connected to a drain of the NMOS enhancement mode transistor M6.

An output voltage of the differential amplifier circuit 2 is taken out from the drain of the NMOS enhancement mode transistor M5 and connected to a gate of the PMOS enhancement mode transistor M7.

An inverting amplifier circuit 4 is formed of the PMOS enhancement mode transistor M7, the NMOS enhancement mode transistor M8, and the current source I2. The PMOS enhancement mode transistor M7 has a source connected to the power source terminal Vdd and a drain connected to a drain of the NMOS enhancement mode transistor M8. The detection voltage Vsen obtained by dividing the voltage inputted to the voltage input terminal Vin by the resistors R1 and R2 is inputted to a gate of the NMOS enhancement mode transistor M8. The current source I2 is connected between the source of the NMOS enhancement mode transistor M8 and the ground potential. An output voltage of the inverting amplifier circuit 4 is taken out from the drain of the PMOS enhancement mode transistor M7 and inputted to the inverter INV1.

The inverters INV1 through INV3 are cascaded. An output voltage of the inverter INV3 is used as the output Vout of the voltage detecting circuit. Here, the inverters INV1 through INV3 are used to realize a high speed response, however, plural inverters are not necessarily used. Effects of the present invention are not influenced at all by, for example, using only the inverter INV1 and using its output voltage as an output voltage of the voltage detecting circuit.

Next, an operation of the voltage detecting circuit is described.

A voltage inputted to the voltage input terminal Vin is divided by the resistors R1 and R2 to be the detection voltage Vsen. The detection voltage Vsen is inputted to the gate of the NMOS enhancement mode transistor M6. Since the reference voltage Vref is inputted to the gate of the NMOS enhancement mode transistor M5, an output voltage of the differential amplifier circuit 2 is determined by comparing the voltage Vsen and the voltage Vref.

When the detection voltage Vsen is lower than the reference voltage Vref, the output voltage of the differential amplifier circuit 2, that is a drain voltage of the NMOS enhancement mode transistor M5 is decreased. Since the output voltage of the differential amplifier circuit 2 is inputted to the gate of the PMOS enhancement mode transistor M7 of the inverting amplifier circuit 4, a drain voltage of the PMOS enhancement mode transistor M7, that is an output voltage of the inverting amplifier circuit 4, rises. When the drain voltage of the PMOS enhancement mode transistor M7 becomes as high as or higher than a threshold voltage of the inverter INV1, the inverter INV1 outputs an L-level signal. Thus, an output signal Vout of the voltage detecting circuit outputted through the INV2 and INV3 becomes L-level as well. As described above, when the power source voltage is decreased, the operation of the inverting amplifier circuit 4 becomes unstable. As a result, an unstable voltage is inputted to the inverter INV1. In view of this, in this embodiment, the NMOS enhancement mode transistor M8 is provided between the drain of the PMOS enhancement mode transistor M7 and the current source I2. A transistor having the same characteristics as the NMOS enhancement mode transistor M2 is used as the NMOS enhancement mode transistor M8. A threshold voltage of the gate of the NMOS enhancement mode transistor M8 is as low as or lower than the reference voltage Vref. The NMOS enhancement mode transistors M8 and M2 may be formed of transistors with different characteristics as long as the threshold voltage of the NMOS enhancement mode transistor M8 is as low as or lower than the threshold voltage of the NMOS enhancement mode transistor M2. In this manner, when the detection voltage Vsen is lower than the reference voltage Vref, impedance of the NMOS enhancement mode transistor M8 is increased. Therefore, the drain voltage of the PMOS enhancement mode transistor M7 is not decreased even when the power source voltage Vdd of the voltage detecting circuit is decreased and impedance of the PMOS enhancement mode transistor M7 is increased. Thus, the input voltage of the inverter INV1 can be kept at an H-level and the level of an output voltage of the voltage detecting circuit can be stabilized.

When the detection voltage Vsen is higher than the reference voltage Vref, on the other hand, the output voltage of the differential amplifier circuit 2, that is the drain voltage of the transistor M5, rises. Since the output voltage of the differential amplifier circuit 2 is inputted to the gate of the PMOS enhancement mode transistor M7 as an input voltage of the inverting amplifier circuit 4, the impedance of the PMOS enhancement mode transistor M7 is increased. As a result, the drain voltage of the PMOS enhancement mode transistor M7 as the output voltage of the inverting amplifier circuit 4 is decreased. When the drain voltage of the PMOS enhancement mode transistor M7 is decreased to be as low as or lower than the threshold voltage of the inverter INV1, the inverter INV1 outputs an H-level signal. Since this signal is inverted by the inverters INV2 and INV3, an H-level signal is outputted as an output voltage of the voltage detecting circuit. At this time, the NMOS enhancement mode transistor M8 is on, therefore, operations are similar to the case where the NMOS enhancement mode transistor M8 is not provided.

In this embodiment, the inverting amplifier circuit 4 serving as an output circuit is formed of the PMOS enhancement mode transistor M7 and the NMOS enhancement mode transistor M8. Therefore, threshold values can be easily controlled in manufacture. Further, since the threshold voltage of the NMOS enhancement mode transistor M8 is set as low as or lower than the reference voltage Vref, load impedance of the inverting amplifier circuit 4 can be controlled only when the detection voltage Vsen is as low as or lower than the reference voltage Vref. Moreover, the reference voltage Vref is a gate voltage of the MOS transistor M2, of which drain current is the drain current of the depletion mode transistor M1 to which a zero bias voltage is applied. Therefore, a MOS transistor having the same characteristics as the MOS transistor M2 used for generating the reference voltage Vref can be used as the NMOS enhancement mode transistor M8.

Figure 2A:
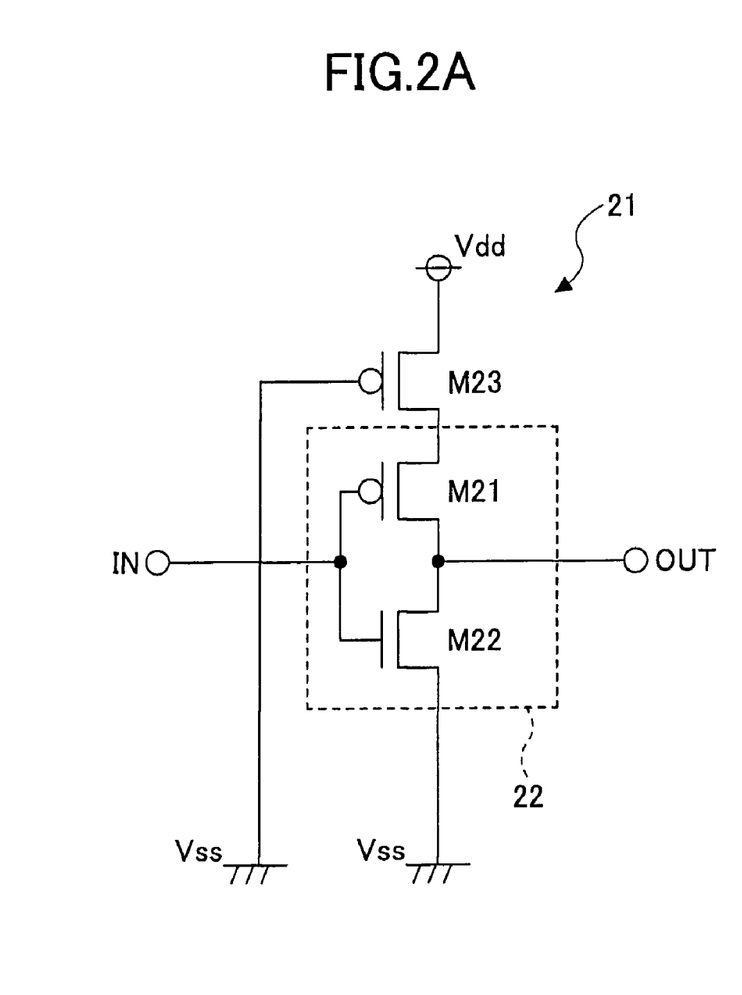
FIGS. 2A and 2B show other embodiments of output circuits of the present invention.
Figure 2B:
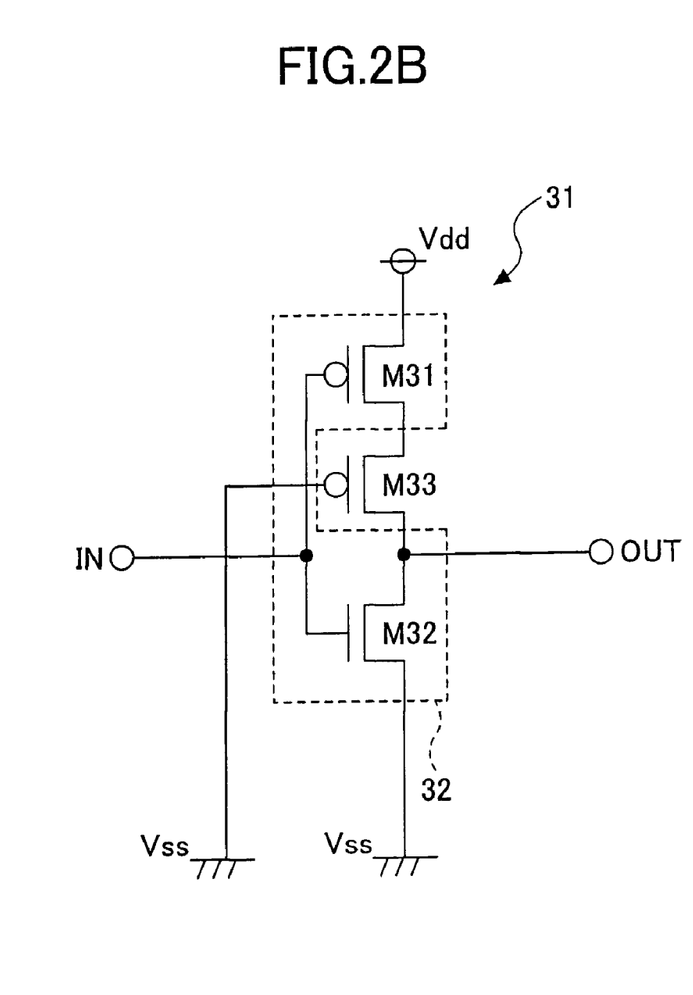

FIGS. 2A and 2B show another embodiment of an output circuit of the present invention. FIG. 2A shows an output circuit 21 and FIG. 2B shows an output circuit 31.

The output circuit 21 shown in FIG. 2A includes an inverter 22 formed of a PMOS enhancement mode transistor M21 and an NMOS enhancement mode transistor M22, and a PMOS enhancement mode transistor M23 connected between the power source terminal Vdd and a source of the PMOS enhancement mode transistor M21. A source of the NMOS enhancement mode transistor M22 and a gate of the PMOS enhancement mode transistor M23 are connected to ground potential Vss. A source of the PMOS enhancement mode transistor M23 is connected to the power source terminal Vdd. The output circuit 31 shown in FIG. 2B includes an inverter 32 formed of a PMOS enhancement mode transistor M31 and an NMOS enhancement mode transistor M32, and a PMOS enhancement mode transistor M33 connected between a drain of the PMOS enhancement mode transistor M31 and a drain of the NMOS enhancement mode transistor M32. A source of the NMOS enhancement mode transistor M32 and a gate of the PMOS enhancement mode transistor M33 are connected to ground potential Vss. A source of the PMOS transistor M31 is connected to the power source terminal Vdd. In FIGS. 2A and 2B, IN and OUT denote an input terminal and an output terminal of the output circuit, respectively.

By using the circuit shown in FIG. 2A or 2B as an output circuit of the voltage detecting circuit, the voltage detecting circuit is operated stably. That is, in the circuits shown in FIGS. 2A and 2B, in a voltage area where the operation of the circuit becomes unstable due to a decrease of the power source voltage Vdd, a path between the power source voltage Vdd and the output terminal OUT is blocked by turning off the PMOS enhancement mode transistor M23 or M33. Accordingly, the output voltage of the output terminal OUT can be stabilized. That is, by connecting the output circuit shown in FIG. 2A or 2B as a subsequent stage after the differential amplifier circuit, the output voltage Vout of the voltage detecting circuit can be kept at a predetermined level even when the power source voltage Vdd is decreased. The level of a decrease in the power source voltage, by which the path between the power source voltage terminal Vdd and the output terminal OUT is determined to be blocked, can be set appropriately as required. The same applies to fourth through seventh embodiments that are described below, in which an NMOS transistor is used instead of the PMOS transistor so that a path between ground potential Vss and the output terminal Vout is blocked when the power source voltage Vdd is decreased.

In FIGS. 2A and 2B, the PMOS transistor M23 or M33 corresponds to the NMOS enhancement mode transistor M8 in FIG. 1. The detection voltage Vsen is inputted to the gate of the NMOS transistor M8 while the gate of each of the PMOS transistor M23 and M33 is grounded so that a function equivalent to that of the NMOS enhancement mode transistor M8 is realized.

Figure 3:
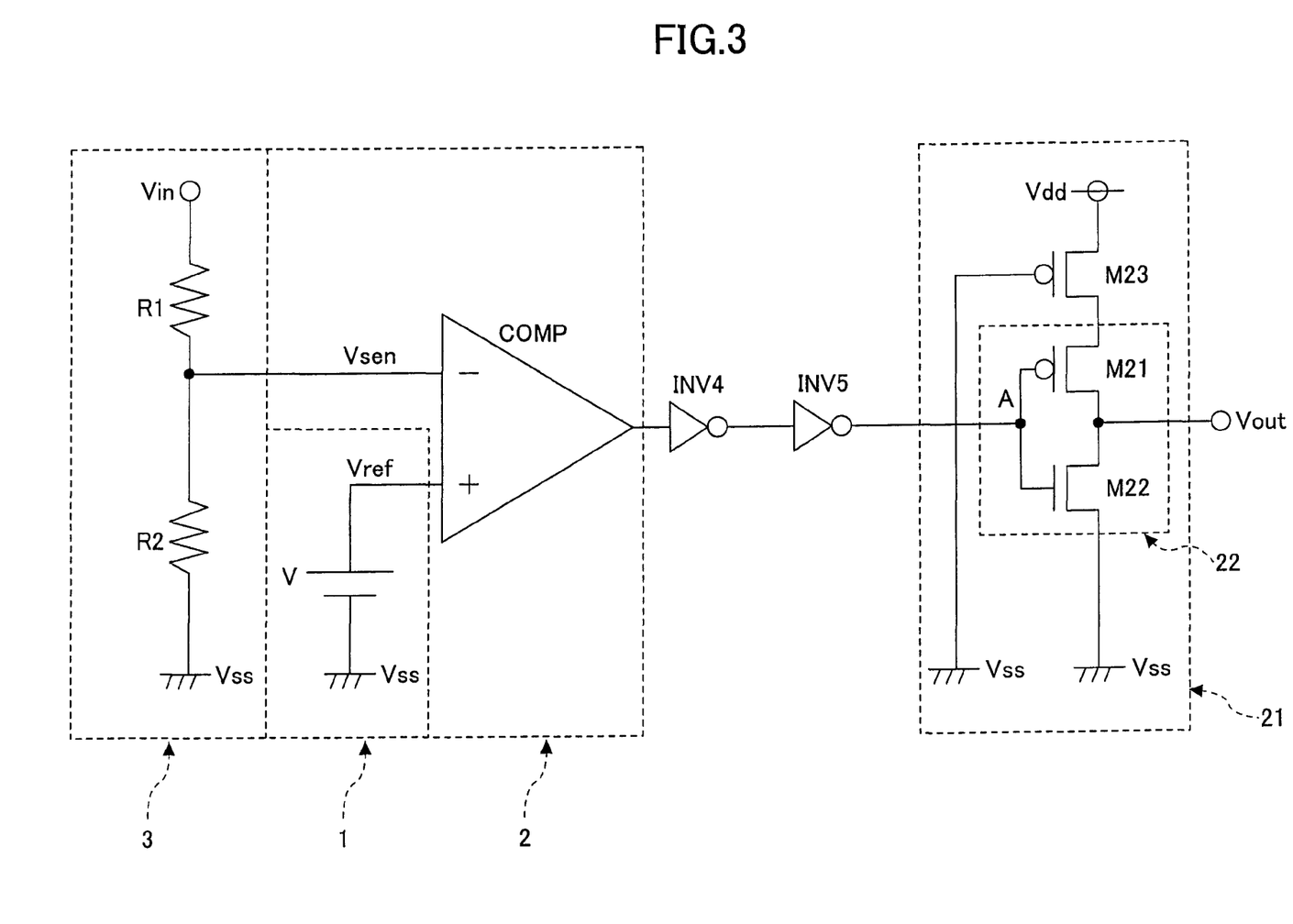
FIG. 3 is a voltage detecting circuit configuration of a second embodiment of the present invention.
Figure 12:
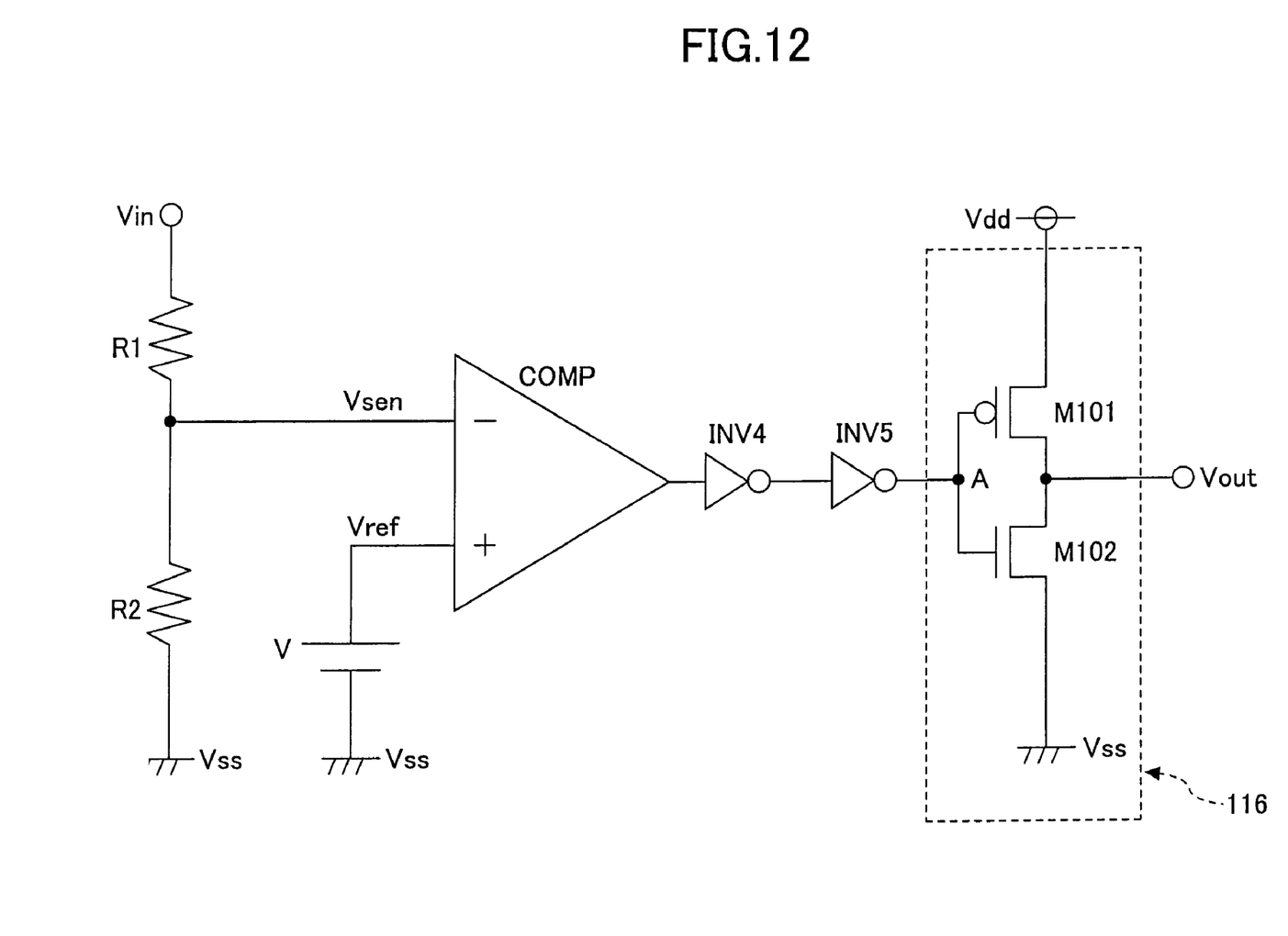
FIG. 12 is a conventional voltage detecting circuit.

FIG. 3 shows a voltage detecting circuit of a second embodiment of the present invention. FIG. 12 shows a conventional voltage detecting circuit as a comparison example. In FIG. 3, an output circuit 21 is provided instead of an output circuit 116 in FIG. 12. That is, the output circuit 21 shown in FIG. 2A is used as an output circuit in FIG. 3.

In FIGS. 3 and 12, the reference voltage Vref generated by the reference voltage generating circuit 1 shown in FIG. 1 is supplied from a power source V, and the comparison circuit formed of the differential amplifier circuit 2 shown in FIG. 1 is expressed by COMP. However, these components as well as a function of the voltage dividing circuit 3 are equivalent to those shown in FIG. 1 and detailed descriptions thereof are omitted. Hereinafter, the same applies to the third through seventh embodiments described with reference to FIGS. 4 to 8.

In such a configuration, a detection voltage Vsen obtained by dividing an input voltage Vin by resistors R1 and R2 is inputted to an inverting input terminal of the comparison circuit COMP. On the other hand, the reference voltage Vref supplied from the power source V is inputted to a non-inverting input terminal of the comparison circuit COMP. An output voltage of the comparison circuit COMP is inputted through inverters INV4 and INV5 to the inverter 22 of the output circuit 21. An output voltage of the output circuit 21 is taken out as the output voltage Vout.

Next, an operation of the voltage detecting circuit shown in FIG. 3 is described.

When the detection voltage Vsen is lower than the reference voltage Vref, the comparison circuit COMP outputs an H-level signal. Therefore, an input voltage A of the inverter 22 becomes the H-level through the inverters INV4 and INV5. Thus, the output voltage Vout becomes an L-level. At this time, when the power source voltage Vdd is decreased, operations of the comparison circuit COMP, and the inverters INV4 and INV5 become unstable. As a result, the input voltage A of the inverter 22 cannot be kept at an H-level. In this embodiment, the PMOS enhancement mode transistor M23 having the gate connected to the ground potential Vss is turned off at this time. Consequently, a path between the power source terminal Vdd and the output terminal Vout is blocked. Therefore, the output voltage Vout can be kept at an L-level even when the power source voltage Vdd is decreased. In this second embodiment, the circuit configuration is simpler and more effective than that of the first embodiment because Vout can be kept at an L-level until Vdd becomes almost 0 V. In addition, since the PMOS enhancement mode transistor M23 capable of blocking the output path is provided in a stage after the inverter provided closest to the output terminal Vout among the plural stages of inverters, the output voltage can be accurately fixed at a required level.

Note that the present invention has been made to solve a defect caused when the detection voltage Vsen becomes lower than the reference voltage Vref and when the power source voltage Vdd becomes lower than the predetermined operational voltage. When Vdd is decreased in the case where Vsen is higher than Vref, Vout is kept at a level existing just before Vdd is decreased. Therefore, no defect is generated. The same applies to the third through seventh embodiments.

Next, a voltage detecting circuit of the third embodiment of the present invention is described with reference to FIG. 4.

Figure 4:
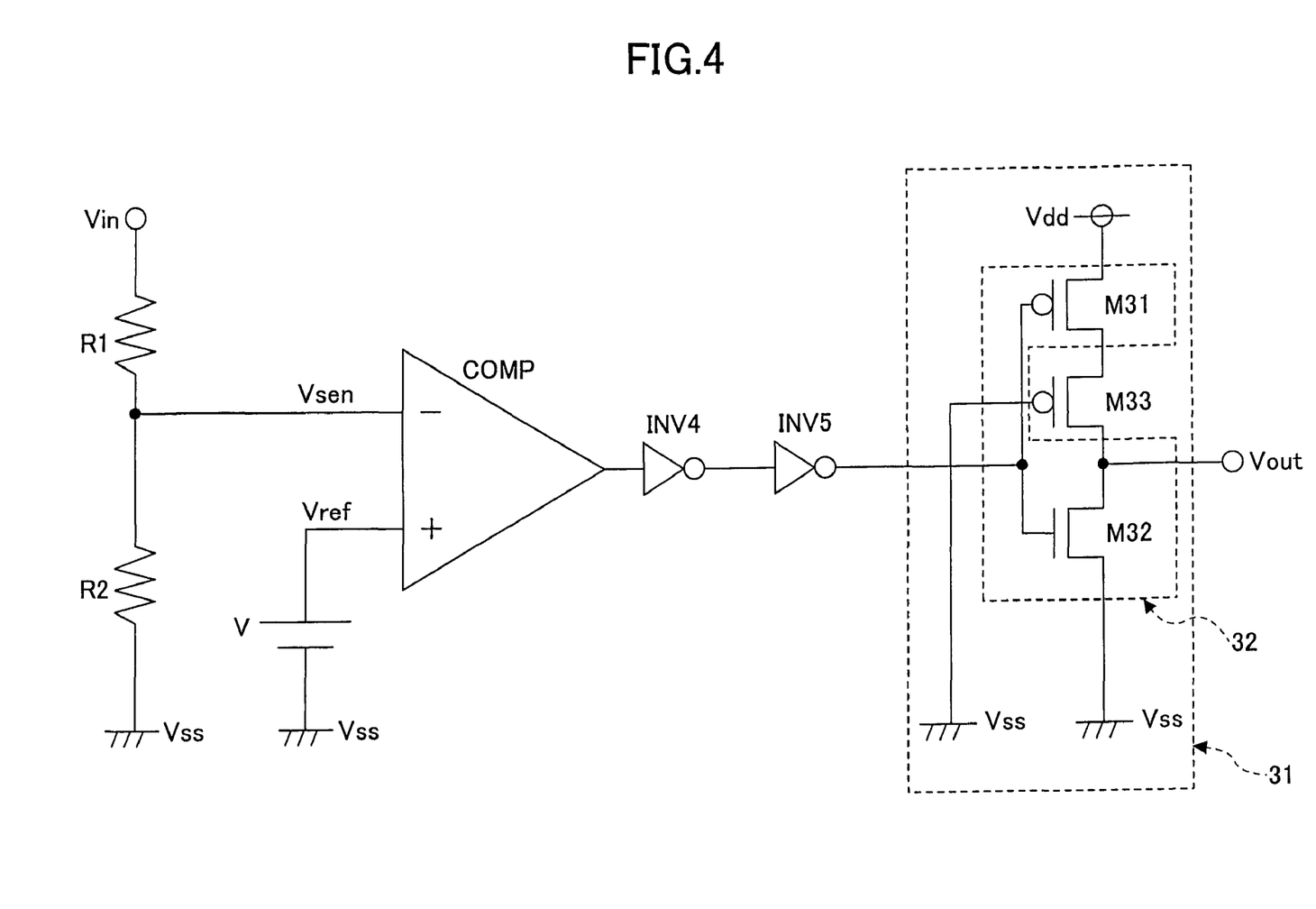
FIG. 4 is a voltage detecting circuit configuration of a third embodiment of the present invention.

In FIG. 4, the output circuit 31 is provided instead of the output circuit 116 in FIG. 12. That is, the output circuit 31 shown in FIG. 2B is used as an output circuit in FIG. 4.

In such a configuration, the detection voltage Vsen obtained by dividing the input voltage Vin is inputted to the inverting input terminal of the comparison circuit COMP. On the other hand, the reference voltage Vref supplied from the power source V is inputted to a non-inverting input terminal of the comparison circuit COMP. Then, an output voltage of the comparison circuit COMP is inputted through the inverters INV4 and INV5 to the inverter 32 formed of the PMOS enhancement mode transistor M31 and the NMOS enhancement mode transistor M32 of the output circuit 31. Further, a drain voltage of the PMOS transistor M33 is taken out as the output voltage Vout.

An operation of the voltage detection circuit shown in FIG. 4 is similar to the second embodiment described with reference to FIG. 3. When the power source voltage Vdd is decreased in the case where the detection voltage Vsen is lower than the reference voltage Vref, the PMOS transistor M33 having the gate connected to ground potential Vss is turned off. Therefore, a path between the power source terminal Vdd and the output terminal Vout is blocked. As a result, the output voltage Vout can be kept at an L-level. Similar to the second embodiment, the circuit configuration of this embodiment is simpler than the first embodiment. Moreover, Vout can be kept at an L-level until Vdd becomes almost 0 V. In addition, since the PMOS enhancement mode transistor M33 capable of blocking the output path is provided in a stage of the inverter provided closest to the output terminal Vout among the plural stages of inverters, the output voltage can be accurately fixed at a required level.

Figure 5:
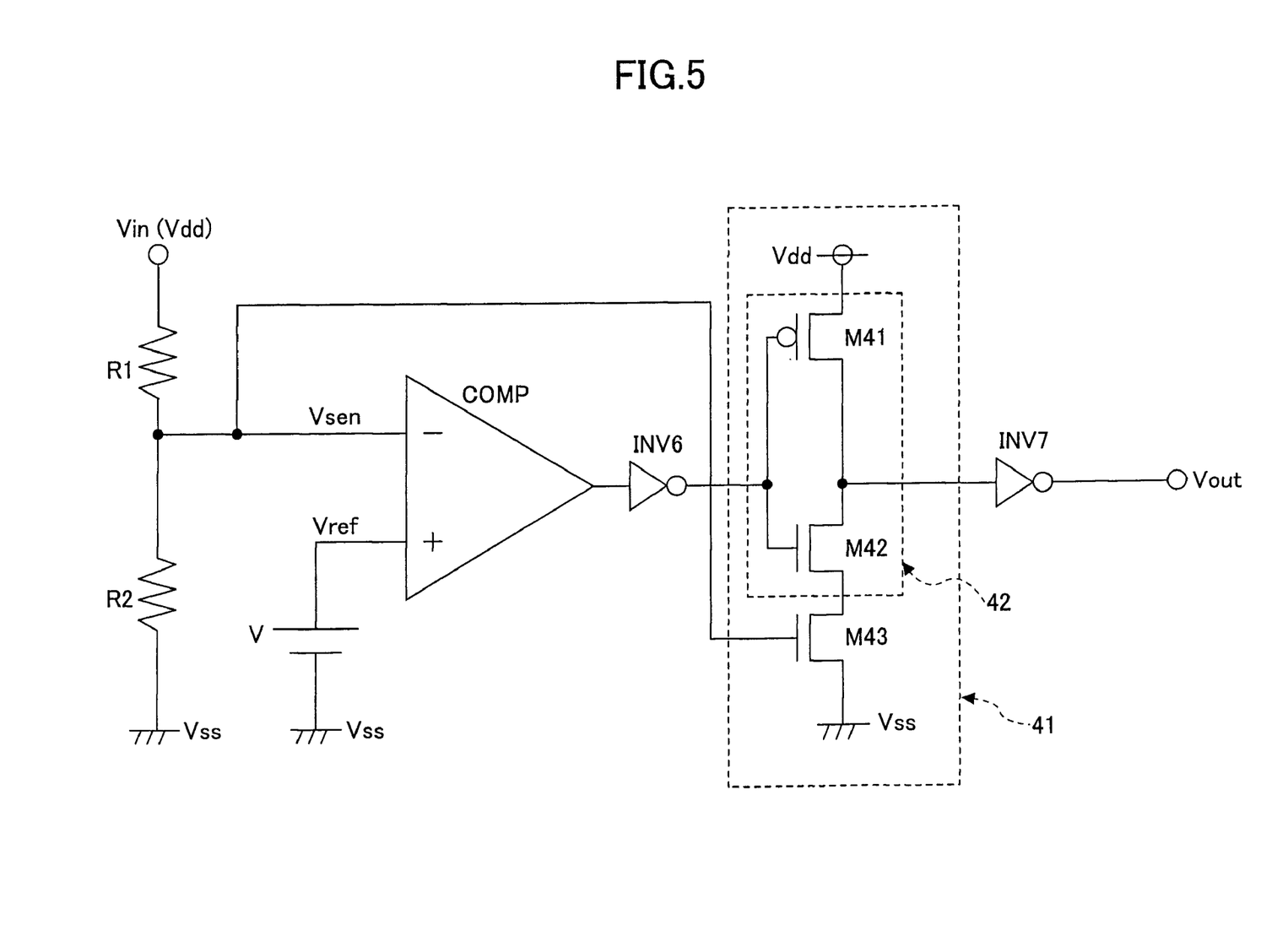
FIG. 5 is a voltage detecting circuit configuration of a fourth embodiment of the present invention.
Figure 6:
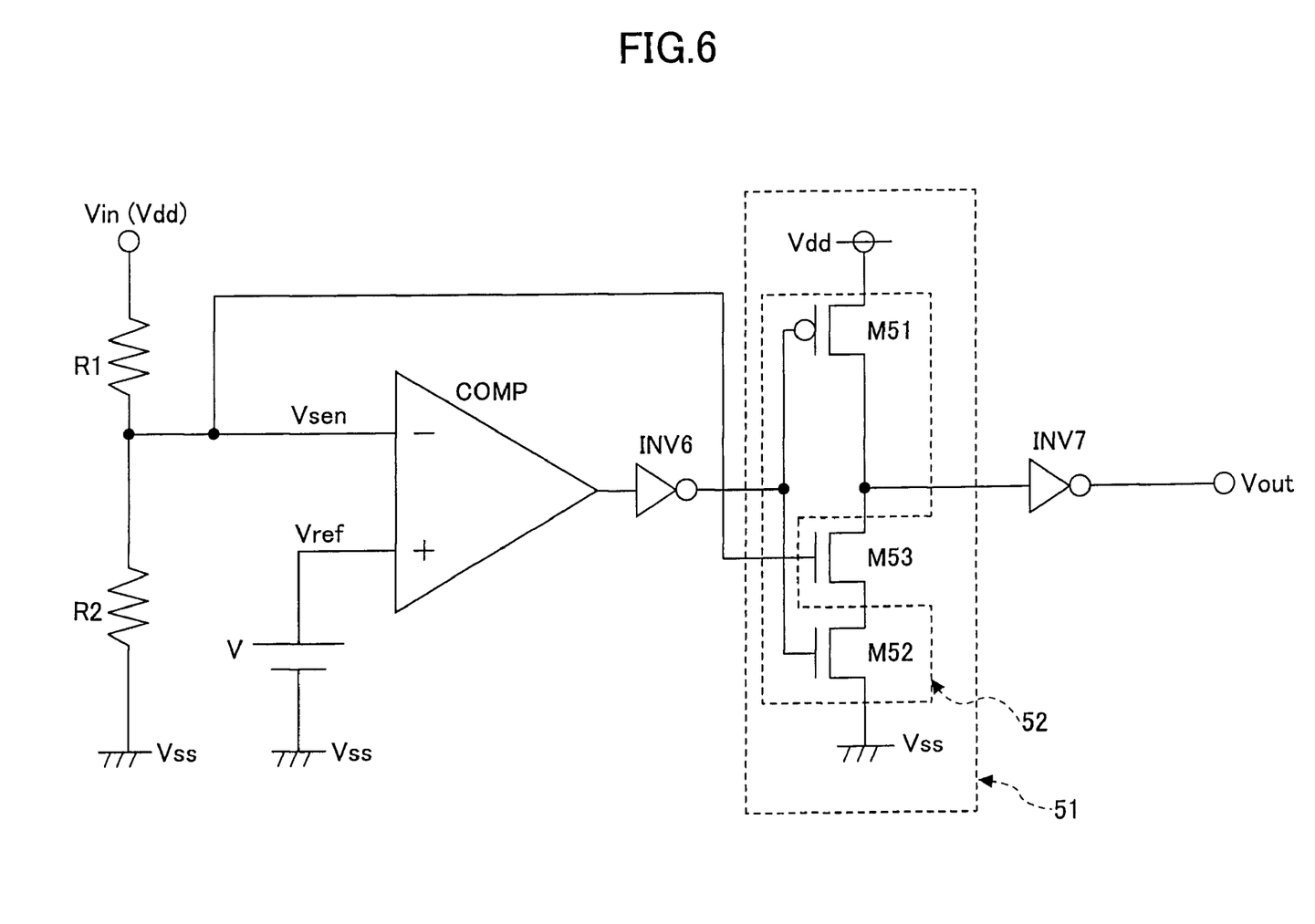
FIG. 6 is a voltage detecting circuit configuration of a fifth embodiment of the present invention.

FIGS. 5 and 6 show voltage detecting circuits of the fourth and fifth embodiments, respectively, of the present invention.

The fourth embodiment is different from the second embodiment described with reference to FIG. 3 in that an NMOS transistor M43 is provided instead of the PMOS enhancement mode transistor M23. Similarly, the fifth embodiment is different from the third embodiment described with reference to FIG. 4 in that an NMOS transistor M53 is provided instead of the PMOS enhancement mode transistor M33.

In FIG. 5, a gate of the NMOS transistor 43 capable of blocking the output path is connected to the detection voltage Vsen obtained by dividing the input voltage Vin by the resistors R1 and R2. An output circuit 41 is connected between inverters INV6 and INV7. In these embodiments, the input voltage Vin and the power source voltage Vdd are short-circuited (that is, Vin=Vdd).

In this configuration, the detection voltage Vsen obtained by dividing the input voltage Vin is inputted to the inverting input terminal of the comparison circuit COMP. On the other hand, the reference voltage Vref supplied from the power source V is inputted to the non-inverting input terminal of the comparison circuit COMP. An output voltage of the comparison circuit COMP is inputted through the inverter INV6 to an inverter 42 formed of a PMOS transistor M41 and an NMOS transistor M42 of the output circuit 41. Moreover, a drain voltage of the PMOS transistor M41 is taken out as the output voltage Vout through the inverter INV7.

In such a configuration, when the detection voltage Vsen becomes lower than the reference voltage Vref, the comparison circuit COMP outputs an H-level voltage. The output voltage Vout becomes an L-level through the inverter INV6, the output circuit 41, and the inverter INV7. When the power source voltage Vdd is decreased at this time, Vsen is decreased as well. Therefore, the NMOS transistor M43 having a gate receiving Vsen is turned off and an input path between ground potential Vss and the inverter INV7 is blocked. As a result, the input voltage of the inverter INV7 is kept at an H-level. Therefore, the output voltage Vout can be kept at an L-level through the inverter INV7.

In the fifth embodiment shown in FIG. 6, the NMOS transistor M53 is connected between the PMOS transistor M51 and the NMOS transistor M52. Similarly to the fourth embodiment, when the power source voltage Vdd is decreased in the case where the detection voltage Vsen is lower than the reference voltage Vref, the NMOS transistor M53 is turned off. As a result, since an input path between ground potential Vss and the inverter INV7 is blocked, the input voltage of the inverter INV7 can be kept at an H-level. Consequently, the output voltage Vout can be kept at an L-level through the inverter INV7.

Figure 7:
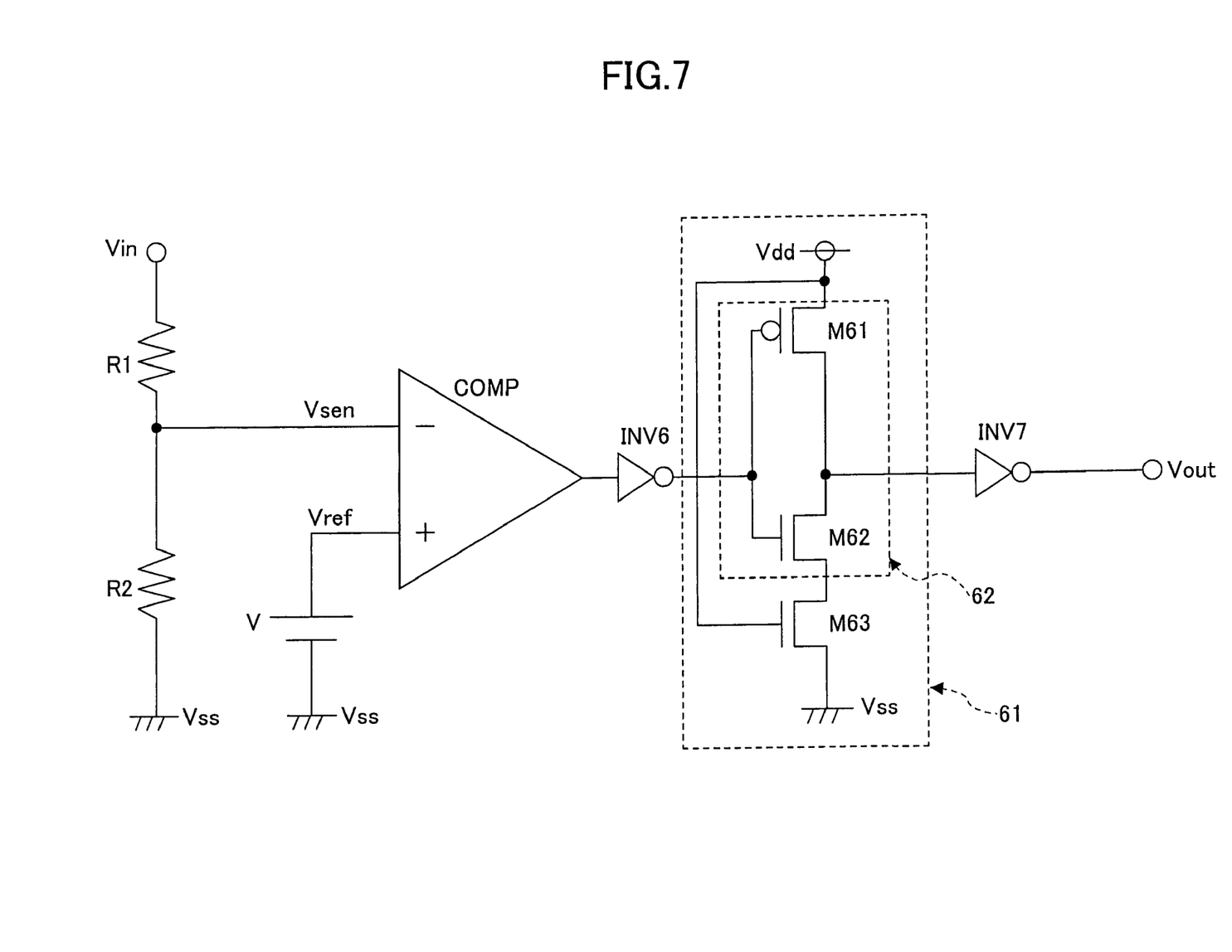
FIG. 7 is a voltage detecting circuit configuration of a sixth embodiment of the present invention.
Figure 8:
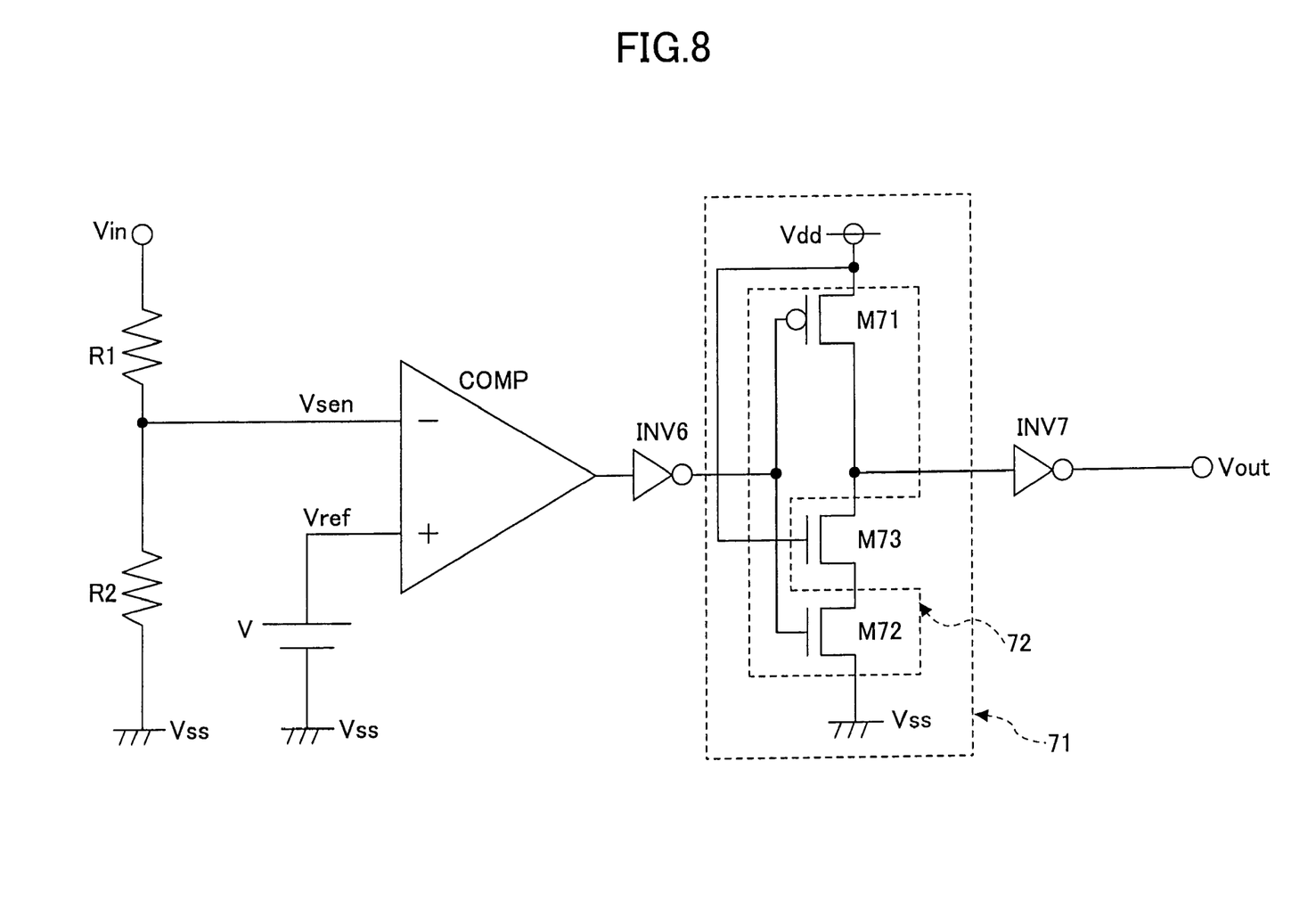
FIG. 8 is a voltage detecting circuit configuration of a seventh embodiment of the present invention.

FIGS. 7 and 8 show voltage detecting circuits of the sixth and seventh embodiments, respectively, of the present invention.

In the sixth embodiment, a gate of an NMOS transistor M63 (that is, the gate of the NMOS transistor M43 of the fourth embodiment described with reference to FIG. 5) is connected to the power source voltage terminal Vdd instead of the detection voltage Vsen. Similarly, in the seventh embodiment, a gate of an NMOS transistor M73 (that is, the gate of the NMOS transistor M53 of the fifth embodiment described with reference to FIG. 6) is connected to the power source voltage terminal Vdd instead of the detection voltage Vsen. These embodiments are different from the fourth or fifth embodiment in that the input voltage terminal Vin and the power source voltage terminal Vdd are not short-circuited and an input voltage independent of Vdd can be detected.

In the sixth or seventh embodiment, an operation is similar to the fourth or fifth embodiment. That is, when the detection voltage Vsen becomes lower than the reference voltage Vref, the comparison circuit COMP outputs an H-level voltage. The output voltage Vout becomes an L-level through the inverter INV6, an output circuit 61 or 71, and the inverter INV7. When the power source voltage Vdd is decreased, the NMOS transistor M63 or M73 having a gate receiving the power source voltage Vdd is turned off. As a result, since an input path between ground potential Vss and the inverter INV7 is blocked, the input voltage of the inverter INV7 is kept at an H-level. Therefore, the output voltage through the inverter INV7 can be kept at an L-level.

In the second and third embodiments, the output circuit 21 or 31 is provided as a subsequent stage of the inverters INV4 and INV5 in, while the output circuits 41 to 71 are provided between the inverters INV6 and INV7 in the fourth through seventh embodiments. This depends on whether the transistors M23, M33, M43, M53, M63, and M73 for stabilizing the level of the output voltage Vout are PMOS transistors or NMOS transistors in the present invention. In the second and third embodiments employing the PMOS transistors M23 and M33, the output voltage of the output circuit 21 or 31 is kept at an L-level due to circuit characteristics. On the other hand, in the fourth through seventh embodiments employing the NMOS transistors M43, M53, M63, and M73, the output voltage of the output circuits 41 to 71 is kept at an H-level. Further, the inverters INV4 through INV7 are used for improving response characteristics. With one stage of inverter, an output level is inverted from an L-level to an H-level, or from an H-level to an L-level. Therefore, plural units of two stages of inverters may be additionally provided since the properties of the circuit are not affected. Therefore, when a PMOS transistor is used for stabilizing the output voltage in these embodiments, an output circuit is to be provided as a subsequent stage after an even-numbered inverter when seen from the comparison circuit COMP. Further, when an NMOS transistor is used for stabilizing the output voltage, an output circuit is to be provided as a subsequent stage after an odd-numbered stage of inverter when seen from the comparison circuit COMP. Consequently, these circuits have equivalent characteristics. It is to be noted that the output circuit can be provided as a subsequent stage after an odd-numbered stage of inverter when a PMOS transistor is used to stabilize the output voltage, and the output circuit can be provided as a subsequent stage after an even-numbered stage of inverter when an NMOS transistor is used to stabilize the output voltage, depending on the required circuit characteristics.

Figure 9:
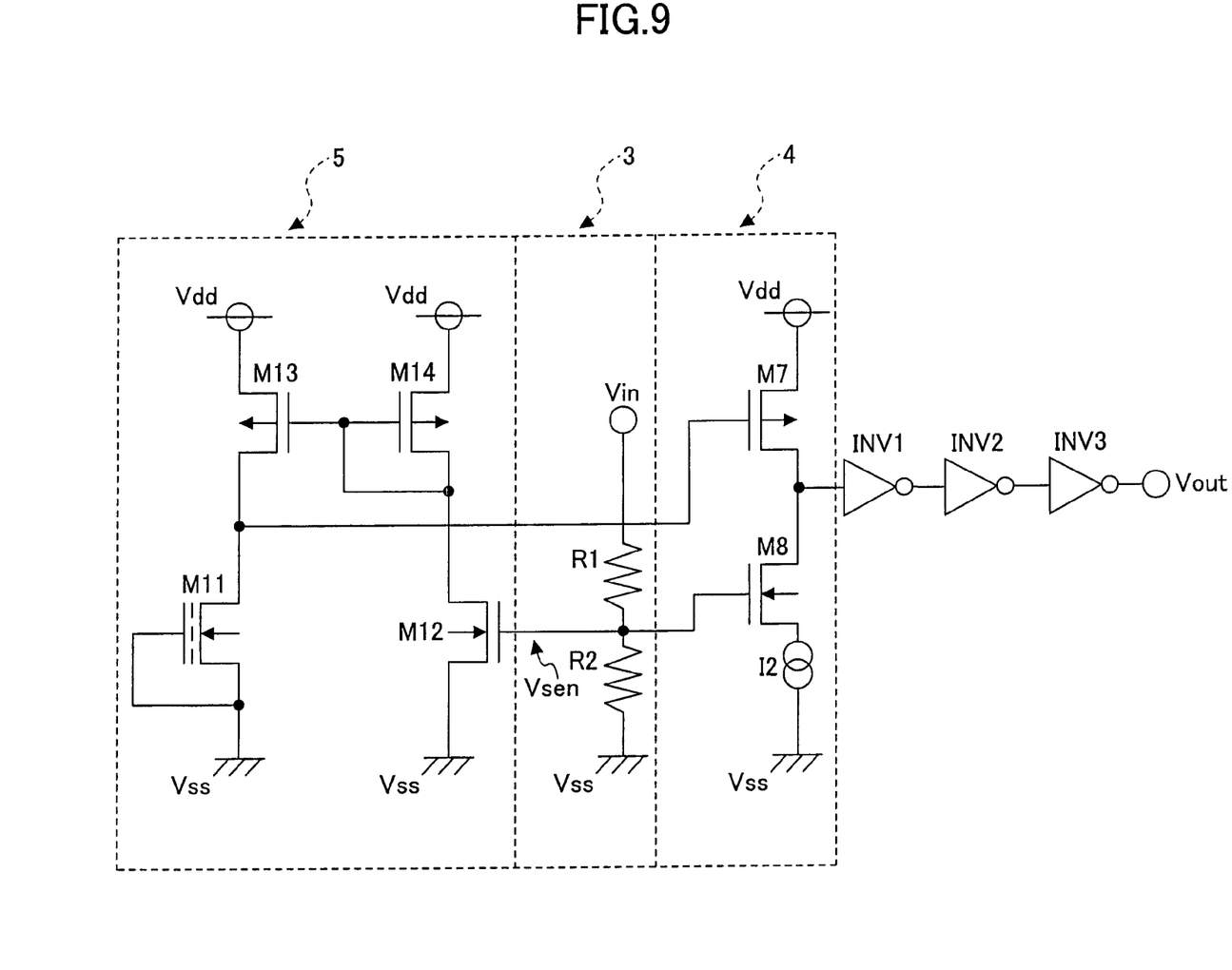
FIG. 9 is a voltage detecting circuit configuration of an eighth embodiment of the present invention.

FIG. 9 shows a voltage detection circuit of an eighth embodiment of the present invention. This voltage detecting circuit is different from FIG. 1 in that a differential amplifier circuit 5 formed of an NMOS depletion mode transistor M11, an NMOS enhancement mode transistor M12, and PMOS enhancement mode transistors M13 and M14 is used instead of the reference voltage generating circuit 1 and the differential amplifier circuit 2 shown in FIG. 1.

A source and a gate of the NMOS depletion mode transistor M11 are grounded, and a drain of the NMOS depletion mode transistor M11 is connected to a drain of the PMOS enhancement mode transistor M13.

The PMOS enhancement mode transistor M13 has a source connected to the power source terminal Vdd and a gate connected to a gate and a drain of the PMOS enhancement mode transistor M14. The PMOS enhancement mode transistor M14 has a source connected to the power source terminal Vdd. Therefore, the PMOS enhancement mode transistor M14 and the PMOS enhancement transistor M13 form a current mirror circuit. Moreover, the drain of the PMOS enhancement mode transistor M14 is connected to a drain of the NMOS enhancement mode transistor M12. The NMOS enhancement mode transistor M12 has a grounded source and a gate receiving the detection voltage Vsen obtained by dividing the voltage inputted to the voltage input terminal Vin by the resistors R1 and R2. Similar to the first embodiment, the voltage Vsen obtained by dividing the voltage inputted to the voltage input terminal Vin by the voltage dividing circuit 3 is the detection voltage in this embodiment. A voltage outputted to the inverting amplifier circuit 4 is taken out from the drain of the NMOS depletion mode transistor M11 and inputted to the gate of the PMOS enhancement mode transistor M7 included in the inverting amplifier circuit 4. Note that a description of the circuit (inverting amplifier circuit 4) on the right side of a serial circuit of the resistors R1 and R2 (voltage dividing circuit 3) in FIG. 9, which is similar to FIG. 1, is not repeated.

Since the source and gate of the NMOS depletion mode transistor M11 are grounded, a zero bias voltage is applied as a gate voltage. Thus, a drain current of the NMOS depletion mode transistor M11 has a predetermined constant current value. This constant current flows as a drain current of the PMOS transistor M13. An output voltage (drain voltage of the NMOS depletion mode transistor M11) of the differential amplifier circuit 5 formed of the transistors M11 through M14 is determined by the drain current of the NMOS depletion mode transistor M11 and the drain current of the NMOS enhancement mode transistor M12. A gate voltage of the NMOS enhancement mode transistor M12 at a time when an output voltage of the differential amplifier circuit 5 is inverted is determined by the drain current of the NMOS depletion mode transistor M11. The gate voltage of the NMOS enhancement mode transistor M12 is used as the reference voltage Vref. In the following description, this voltage is called a deemed reference voltage Vref.

In this circuit, the same transistors are used as the NMOS transistors M8 and M12 so that the threshold voltage of the NMOS enhancement mode transistor M8 is as low as or lower than the threshold voltage of the NMOS enhancement mode transistor M12. The NMOS enhancement mode transistors M8 and M12 may be formed of different transistors as long as the threshold voltage of the NMOS enhancement mode transistor M8 is as low as or lower than the threshold voltage of the NMOS enhancement mode transistor M12.

When the voltage Vsen is higher than the deemed reference voltage Vref, the drain voltage of the NMOS depletion transistor M11 rises. Then, impedance of the PMOS enhancement mode transistor M7 is increased, thereby the input voltage of the inverter INV1 is decreased to be as low as or lower than the threshold voltage of the inverter INV1. As a result, the output voltage Vout of the voltage detecting circuit becomes an H-level. Since the NMOS enhancement mode transistor M8 is on, the NMOS enhancement mode transistor M8 functions only to connect the constant current source I2 to a load of the PMOS enhancement mode transistor M7 and does not affect the operation of the voltage detecting circuit.

When the detection voltage Vsen is lower than the deemed reference voltage Vref, the NMOS enhancement transistor M12 is turned off. As a result, the drain voltage of the NMOS depletion mode transistor M11 is decreased. Then, since the impedance of the PMOS enhancement mode transistor M7 is decreased, the input voltage of the inverter INV1 is raised to be as high as or higher than the threshold voltage of the inverter INV1. Moreover, the impedance of the NMOS enhancement mode transistor M8 is increased, therefore, the input voltage of the inverter INV1 is further increased. As a result, the volatge detecting circuit outputs an L-level output voltage Vout.

When the power source voltage Vdd of the voltage detecting circuit is decreased in the case where the detection voltage Vsen is lower than the deemed reference voltage Vref, a gate-source voltage of the PMOS enhancement mode transistor M7 falls so that the impedance of the PMOS enhancement transistor M7 is increased. However, since the impedance of the NMOS enhancement mode transistor M8 is high, the drain voltage of the PMOS enhancement mode transistor M7 can be kept at an H-level. As a result, an operation of the voltage detecting circuit can be stabilized.

According to one embodiment, a voltage detecting circuit of the present invention can detect a voltage correctly even when a power source voltage is decreased, and can be manufactured easily.

This patent application is based on Japanese Priority Patent Application No. 2008-013449 filed on Jan. 24, 2008, and Japanese Priority Patent Application No. 2008-078182 filed on Mar. 25, 2008, the entire contents of which are hereby incorporated herein by reference.

What is claimed is:

1. A voltage detecting circuit for comparing a voltage to be detected with a reference voltage and outputting an output signal having a level depending on the comparison, the voltage detecting circuit comprising:
   an inverting amplifier circuit configured to receive an intermediate signal having a level depending on the comparison and output the output signal,
   wherein the inverting amplifier circuit includes an active element having a control terminal, a threshold voltage of the control terminal being as low as or lower than the reference voltage; and
   the voltage to be detected is applied to the control terminal of the active element.

2. The voltage detecting circuit as claimed in claim 1, further comprising a first MOS transistor, wherein the reference voltage is a voltage between a gate and a source of the first MOS transistor, which is obtained when a constant current is supplied to a drain terminal of the first MOS transistor; and the active element is a second MOS transistor having a threshold voltage as low as or lower than a threshold voltage of the first MOS transistor.

3. The voltage detecting circuit as claimed in claim 2, further comprising a MOS depletion mode transistor, wherein the constant current supplied to the drain terminal of the first MOS transistor is a drain current of the MOS depletion mode transistor to which a zero bias voltage is applied.

4. The voltage detecting circuit as claimed in claim 2, further comprising a MOS depletion mode transistor, wherein the constant current supplied to the drain terminal of the first MOS transistor is generated by a current mirror of a drain current of the MOS depletion mode transistor to which a zero bias voltage is applied.

5. A voltage detecting circuit for comparing a voltage to be detected with a reference voltage and outputting an output signal having a level depending on the comparison, the voltage detecting circuit comprising:
- a first power source terminal;
- a second power source terminal;
- a reference voltage generating circuit capable of generating the reference voltage;
- a differential amplifier circuit; and
- an inverting amplifier circuit,
- wherein the inverting amplifier circuit includes a first MOS enhancement mode transistor having a source terminal connected to the first power source terminal, and a second MOS enhancement mode transistor having a source terminal connected to the second power source terminal through a current source, drain terminals of the first and second MOS enhancement mode transistors being connected to each other;
- the voltage to be detected and the reference voltage are inputted to the differential amplifier circuit;
- an output signal of the differential amplifier circuit is inputted to a gate terminal of the first MOS enhancement mode transistor and the voltage to be detected is inputted to a gate terminal of the second MOS enhancement mode transistor; and
- a connection between the drain terminals of the first and second MOS enhancement mode transistors functions as an output of the voltage detecting circuit.

6. The voltage detecting circuit as claimed in claim 5, further comprising a third MOS enhancement mode transistor in the reference voltage generating circuit, wherein the reference voltage is a voltage between a gate and a source of the third MOS enhancement mode transistor when a constant current is supplied to a drain of the third MOS enhancement mode transistor; and
- a threshold voltage of the second MOS enhancement mode transistor is as low as or lower than a threshold voltage of the third MOS enhancement mode transistor.

7. The voltage detecting circuit as claimed in claim 5, wherein the second power source terminal is a ground terminal.

8. A voltage detecting circuit for comparing a voltage to be detected with a reference voltage and outputting an output signal having a level depending on the comparison, the voltage detecting circuit comprising:
- a first power source terminal;
- a second power source terminal; and
- an output circuit through which the output signal is outputted,
- wherein the output circuit includes an inverter and an active element connected in series between the first power source terminal and the second power source terminal; and
- the level of the output signal is stabilized by turning off the active element when a voltage of the first power source terminal is decreased lower than a predetermined level.

9. The voltage detecting circuit as claimed in claim 8, wherein the active element is a PMOS transistor having a gate connected to the second power source terminal.

10. The voltage detecting circuit as claimed in claim 8, wherein the active element is an NMOS transistor having a gate configured to receive the voltage to be detected, which is generated by dividing the voltage of the first power source.

11. The voltage detecting circuit as claimed in claim 8, wherein the active element is an NMOS transistor having a gate connected to the first power source terminal.

12. The voltage detecting circuit as claimed in claim 8, wherein the second power source terminal is a ground terminal.

13. The voltage detecting circuit as claimed in claim 1, further comprising a voltage dividing circuit,
- wherein the voltage to be detected is generated by dividing an input voltage by the voltage dividing circuit.

14. The voltage detecting circuit as claimed in claim 1, further comprising at least one inverter,
- wherein the output signal of the voltage detecting circuit is outputted through the at least one inverter.

* * * * *